United States Patent
Shibuya (10) Patent No.: US 10,181,435 B2
(45) Date of Patent: Jan. 15, 2019

(54) LEAD FRAME ASSEMBLY

(71) Applicant: Texas Instruments Incorporated, Dallas, TX (US)

(72) Inventor: Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 197 days.

(21) Appl. No.: 14/930,142

(22) Filed: Nov. 2, 2015

(65) Prior Publication Data

US 2017/0125325 A1   May 4, 2017

(51) Int. Cl.
*H01L 23/495* (2006.01)
*H01L 23/31* (2006.01)
*H01L 23/00* (2006.01)

(52) U.S. Cl.
CPC ...... *H01L 23/49551* (2013.01); *H01L 23/495* (2013.01); *H01L 23/49575* (2013.01); *H01L 23/3121* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/291* (2013.01); *H01L 2224/2919* (2013.01); *H01L 2224/32245* (2013.01); *H01L 2224/48091* (2013.01); *H01L 2224/48247* (2013.01); *H01L 2224/73265* (2013.01); *H01L 2224/83851* (2013.01); *H01L 2224/92247* (2013.01); *H01L 2224/97* (2013.01); *H01L 2924/19042* (2013.01); *H01L 2924/19105* (2013.01); *H01L 2924/19107* (2013.01)

(58) Field of Classification Search
CPC ..... H01L 2224/48247; H01L 23/49551; H01L 23/49575; H01L 23/49582; H01L 23/645; H01L 2924/19107
USPC ........................................ 257/784
See application file for complete search history.

(56) References Cited

U.S. PATENT DOCUMENTS

| | | | | |
|---|---|---|---|---|
| 5,839,184 A * | 11/1998 | Ho | ........................... | H01F 17/00 29/605 |
| 6,775,901 B1 * | 8/2004 | Lee | ..................... | H01F 17/0033 29/602.1 |
| 6,815,836 B2 * | 11/2004 | Ano | ........................ | H01L 24/48 257/686 |
| 8,389,868 B2 * | 3/2013 | Leipold | ................. | H01L 23/645 174/260 |
| 2002/0130406 A1 * | 9/2002 | Mohammed | ........ | H01L 21/6835 257/692 |
| 2003/0005569 A1 * | 1/2003 | Hiatt | ................... | H01F 17/0006 29/602.1 |
| 2005/0285262 A1 * | 12/2005 | Knapp | .................. | H01L 23/495 257/723 |

(Continued)

Primary Examiner — Daniel Whalen
(74) Attorney, Agent, or Firm — Dawn Jos; Charles A. Brill; Frank D. Cimino (57) ABSTRACT

A leadframe assembly includes a leadframe having a die attach pad and a first plurality of leads. A first generally sine wave-shaped wire having a first end and a second end has a first end of thereof attached to a first one of the first plurality of leads and the second end thereof attached to a second one of the first plurality of leads. A method of making a leadframe assembly includes forming an inductor on a leadframe by bending a first wire into a generally sine wave-shaped configuration and attaching the first wire to a first set of leads of the leadframe.

18 Claims, 10 Drawing Sheets

(56) References Cited

U.S. PATENT DOCUMENTS

| | | | | |
|---|---|---|---|---|
| 2009/0026605 A1* | 1/2009 | Gupta | ................ | H01L 23/3677 |
| | | | | 257/712 |
| 2013/0203216 A1* | 8/2013 | Sato | ................... | H01L 23/3121 |
| | | | | 438/107 |
| 2013/0307117 A1* | 11/2013 | Koduri | ................. | H01L 23/645 |
| | | | | 257/531 |

* cited by examiner

201 — FORMING AN INDUCTOR ON A LEADFRAME BY BENDING A FIRST WIRE INTO A GENERALLY SINE WAVE SHAPED CONFIGURATION AND ATTACHING IT TO A FIRST SET OF LEADS OF THE LEADFRAME

FIG. 14

LEAD FRAME ASSEMBLY

BACKGROUND

Integrated circuit dies include active circuit elements, such as transistors. The active circuit elements must sometimes be connected to passive circuit elements such as inductors, capacitors and resistors in order to perform desired operations. Inductors and other passive circuit elements are usually provided as separate discrete components that are connected to an integrated circuit die, rather than being formed as part of the die itself.

SUMMARY

A leadframe assembly includes a leadframe having a die attach pad (DAP) and a first plurality of leads. A first generally sine wave-shaped wire having a first end and a second end has the first end thereof attached to a first one of the first plurality of leads and the second end thereof attached to a second one of the first plurality of leads to form an inductor on the leadframe.

An integrated circuit package includes a leadframe having a die attach pad (DAP) and a first and second plurality of leads. First and second generally sine wave-shaped wires are attached to the first and second plurality of leads, respectively, said the wire positioned in opposed, spaced apart relationship with the second wire. At least one die is mounted on the DAP and electrically connected to the first and second wires.

A method of making a leadframe assembly includes forming an inductor on a leadframe by bending a first wire into a generally sine wave-shaped configuration and attaching the first wire to a first set of leads of the leadframe.

BRIEF DESCRIPTION OF THE DRAWINGS

FIG. 10 A is a schematic side elevation view of the lead frame embodiment of FIG. 10.

DETAILED DESCRIPTION

Figure 1:
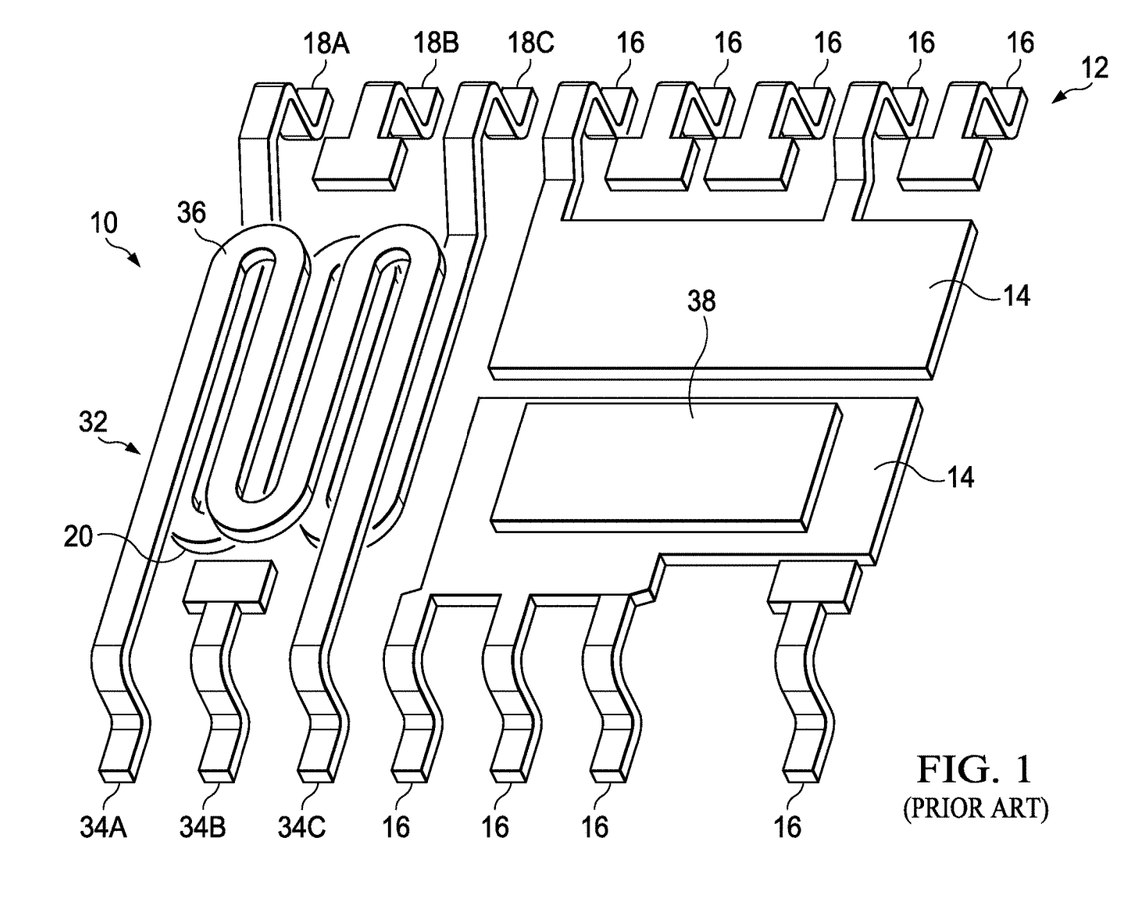
FIG. 1 is an isometric view of a prior art double lead frame assembly.

FIG. 1 is an isometric view of a prior art double leadframe assembly 10. The assembly 10 has a first lead frame 12 with a die attachment pad (DAP) 14. A plurality of leads 16 are positioned on each lateral side of the die attach pad 14. First lead frame 12 has a second plurality of leads 18A, 18B, 18C that are longitudinally spaced from the die attach pad 14. A generally M-shaped lead extension 20 is integrally formed with the leads 18A and 18C.

This further reference to FIG. 1, a second lead frame 32 including leads 34A, 34B, 34C, has a second M-shaped lead extension 36 that is integrally attached to leads 34A and 34C. This second lead frame 32 overlies the first lead frame 12, forming an inductor assembly therewith. In FIG. 1, a single die 38 is conventionally mounted on the die attach pad 14.

FIGS. 2-6 illustrate the method by which the double lead frame assembly 10 of FIG. 1 is constructed.

Figure 2:
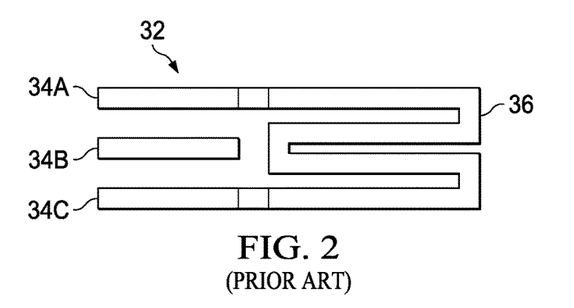
FIG. 2 is a schematic top plan view of a first lead frame of the assembly of FIG. 1.
Figure 2A:
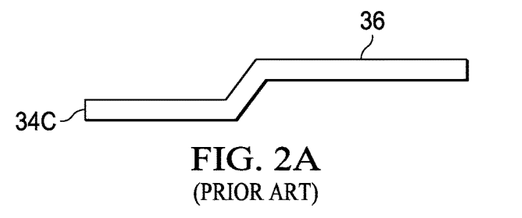
FIG. 2A is a schematic side elevation view of the first lead frame shown in FIG. 2.

FIG. 2 is a schematic top plan view of the second lead frame 32 of the double leadframe assembly 10 of FIG. 1 prior to its assembly with the first leadframe 12. FIG. 2A is a schematic side elevation view of this second lead frame 12.

Figure 3:
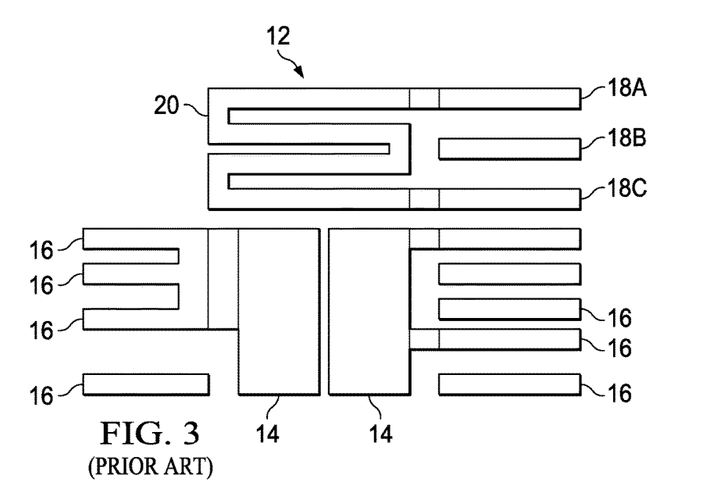
FIG. 3 is a schematic top plan view of a second lead frame of the lead frame assembly of FIG. 1.
Figure 3A:
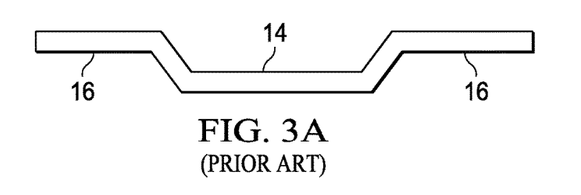
FIG. 3A is a schematic side elevation view of the second lead frame shown in FIG. 3.

FIG. 3 is a top plan view and FIG. 3A is a side elevation view of the first lead frame 12 of the double lead frame assembly 10 of FIG. 1, prior to its assembly with the second leadframe 32.

Figure 4:
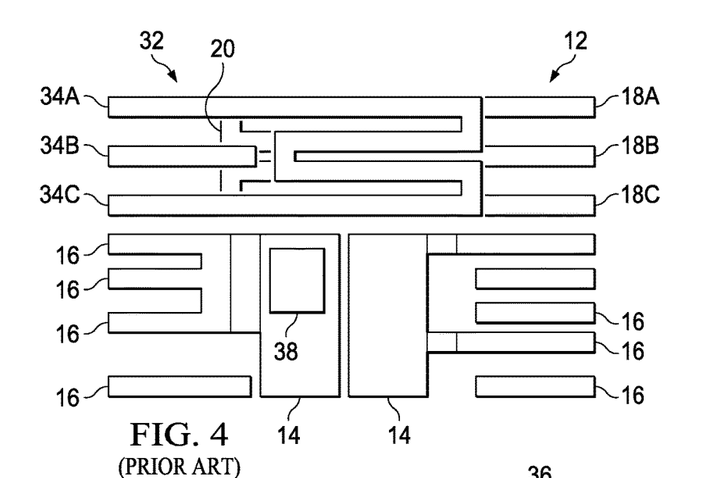
FIG. 4 is a schematic top plan view of a lead frame assembly having the first lead frame illustrated in FIGS. 2 and 2A positioned in overlying relationship with the second lead frame illustrated in FIGS. 3 and 3A.

FIG. 4 is a schematic top plan view of a lead frame assembly in which the second lead frame 32 illustrated in FIGS. 2 and 2A is positioned in overlying relationship with the first lead frame 12 illustrated in FIGS. 3 and 3A. The die 38 has been mounted on the die attach pad 14.

Figure 4A:
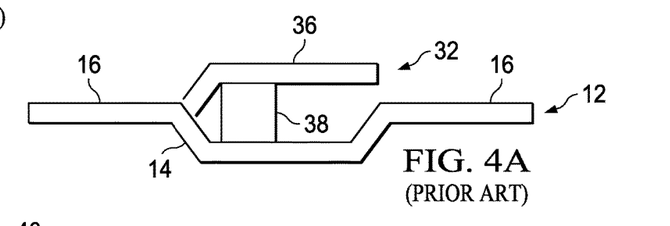
FIG. 4A is a schematic side elevation view of the lead frame assembly shown in FIG. 4.
Figure 5:
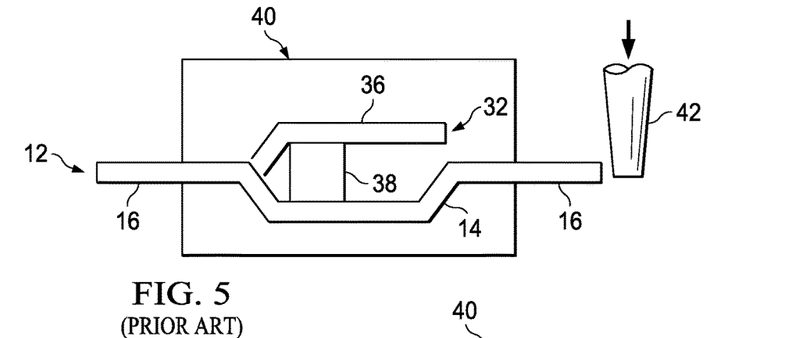
FIG. 5 is a schematic cross-sectional side elevation view of the lead frame assembly shown in FIGS. 4 and 4A after molding and during lead cutting.

FIG. 5 is a schematic side elevation view of the lead frame assembly shown in FIGS. 4 and 4A after molding thereof and during lead singulation. As illustrated in FIG. 5, prior to singulation the assembly has been molded and thus a layer of mold compound 40 covers the die attach pad 14 and die 38 and portions of the leads 16, 16A, etc., and 34A, etc. These lead portions project outwardly from the mold compound 40 and are subsequently singulated as with a singulation saw or punch 42 to separate the leadframes 12, 32 from adjacent integrally connected leadframes (not shown) in upper and lower leadframe sheets (not shown).

Figure 6:
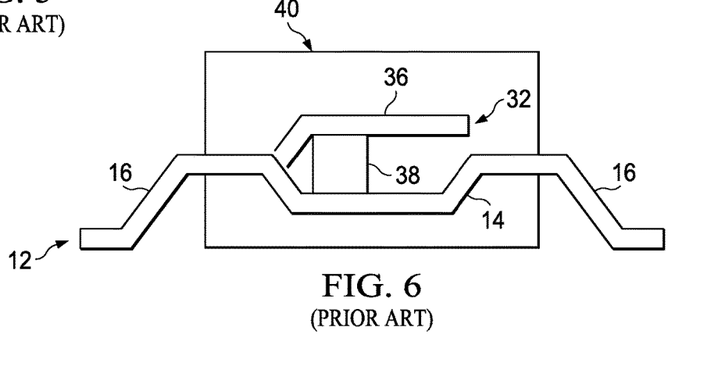
FIG. 6 is a schematic cross-sectional side elevation view of the lead frame assembly of FIG. 5 after lead forming has produced an integrated circuit package.

As illustrated in FIG. 6, after lead singulation, the leads 16, etc., are formed into a final shape, corresponding to that of the leads 16 illustrated in FIG. 1. Thus an integrated circuit package 40 is formed that includes an inductor assembly provided by overlapping portions of the two separate leadframes 12, 32.

Figure 7:
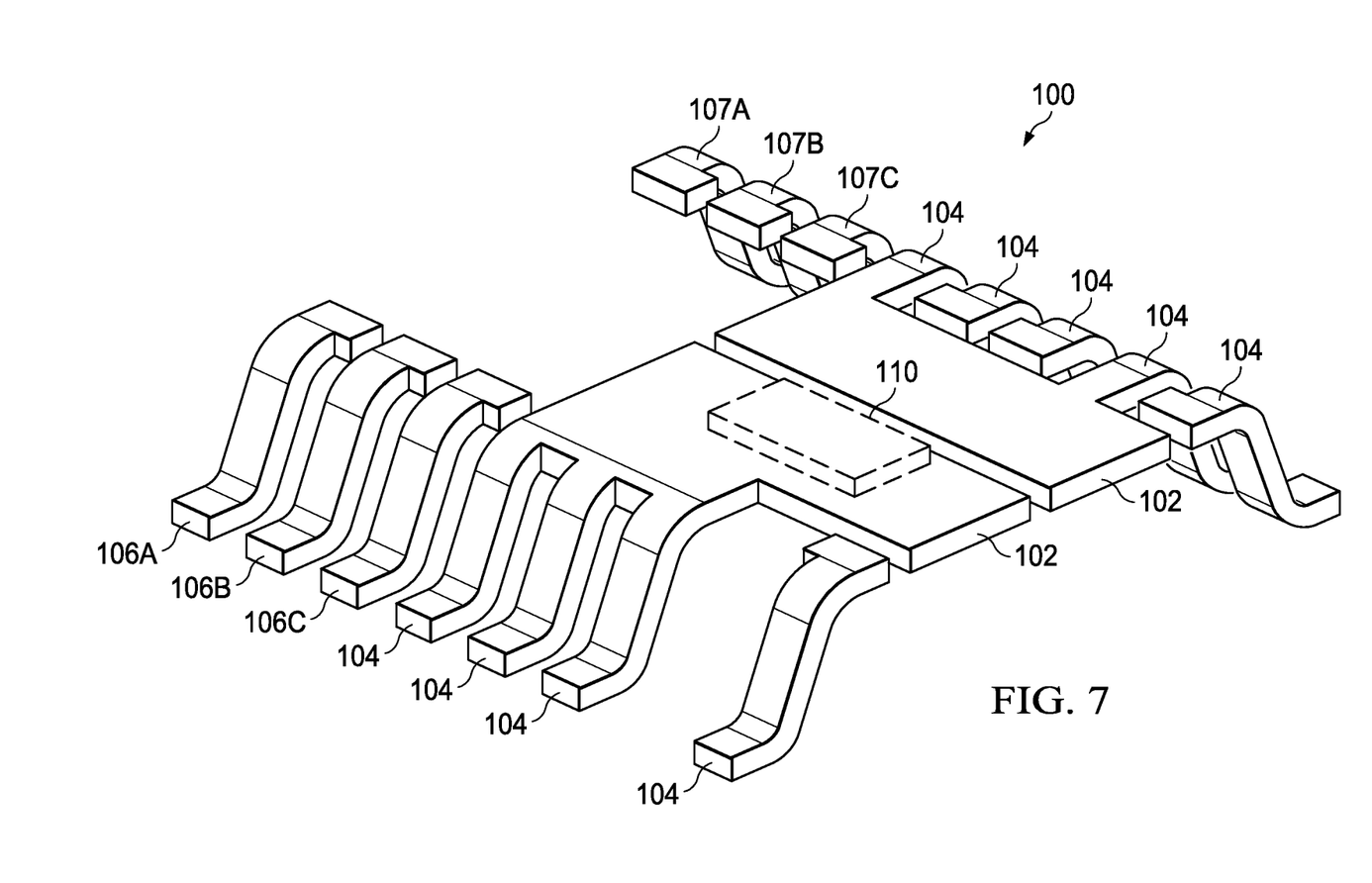
FIG. 7 is an isometric view of an example leadframe embodiment.

FIG. 7 is an isometric view of an example leadframe embodiment comprising a single lead frame 100. Lead frame 100 includes a die attach pad 102, a plurality of leads 104 adjacent to the die attach pad 102 and a plurality of leads 106A, 106B, 106C, and 107A, 107B, 107C, that are longitudinally spaced from the die attach pad 102. A die 110 is mounted on the die attach pad 102. In one embodiment the die 110 has an electrical contact surface on the bottom thereof that is electrically connected to the die attach pad 102, as by solder or conductive adhesive. (In another embodiment the die 110 may be connected to the die attach pad and/or various leads by wire bonding.) The die attach pad 102 illustrated in FIG. 7 is a split pad that may in some embodiments have one or more dies mounted on each half thereof.

Figures 8, 8A:
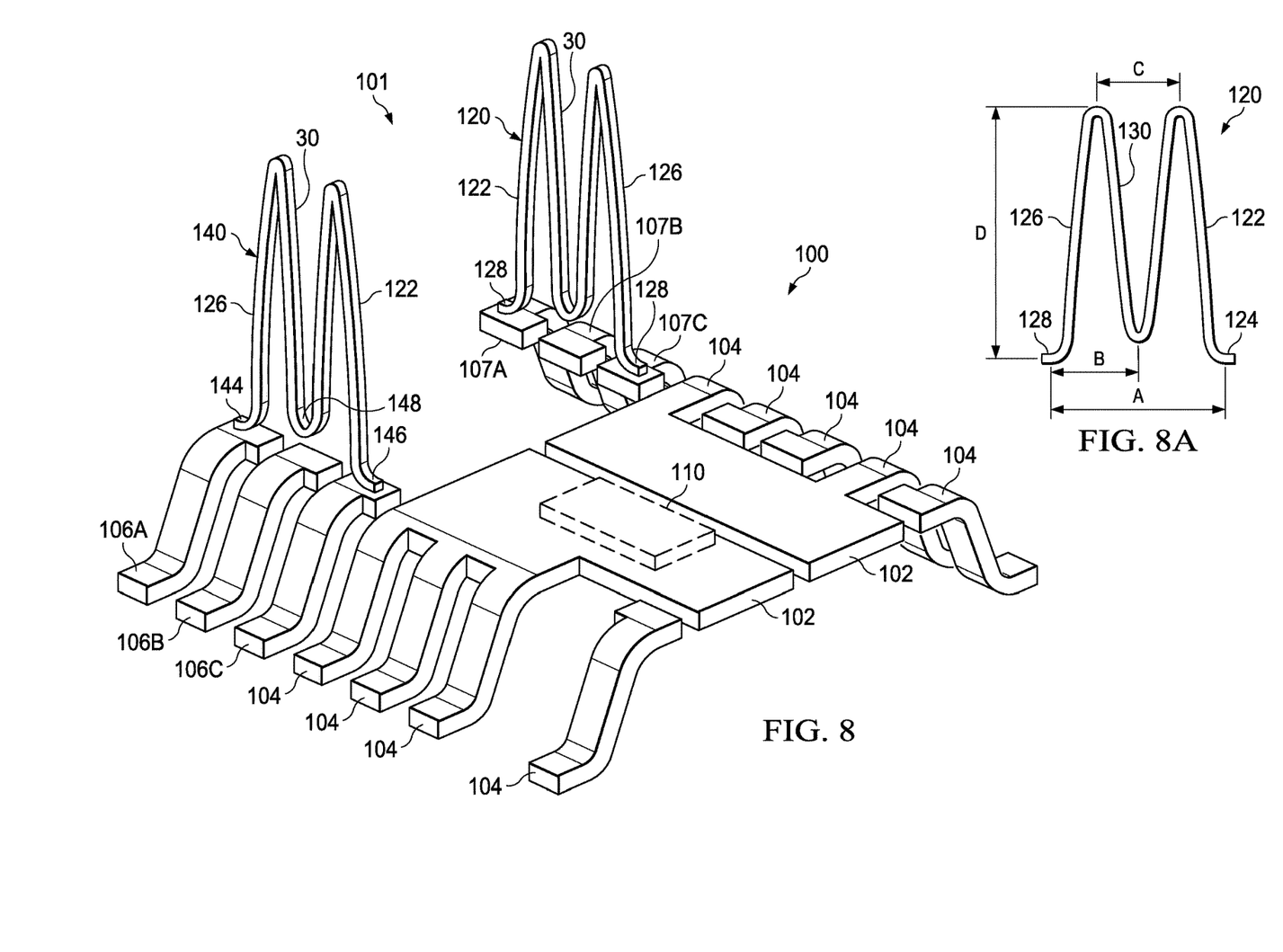
FIG. 8 is an isometric view of the example leadframe embodiment of FIG. 7 with sine wave-shaped wires attached to leads thereof.
FIG. 8A is an example embodiment of one of the sine wave shaped wires shown in FIG. 8.

FIG. 8 is an isometric view of the example leadframe embodiment 100 of FIG. 7, but with two sine wave-shaped wires 120, 140 attached thereto, and now referenced as leadframe assembly 101. FIG. 8A is a side elevation view of an example embodiment of one of the sine wave shaped wires 120, which may be identical to the other wire 140. The wire 120, in this example embodiment, is generally M-shaped and comprises a first leg portion 122 having a first foot portion 124; a second leg portion 126 having a second foot portion 128 and a generally V-shaped intermediate portion 130 integrally connected to the upper ends of the two leg portions 122, 126. In one example embodiment the distance "a" between the two foot portions 124, 128 may be about 750 µm; the distance "b" between each foot portion 124, 128 and the bottom end of the V-shaped portion 130 may be about 250 µm; the distance "c" between the two upper ends of the V-shaped portion may be about 250 µm; and the height "d" from the bottom of the V-shaped portion 130 to the top of the V-shaped portion may be about 3 mm.

As further illustrated by FIG. 8, the first wire 120 may have a first foot portion 124 thereof attached to lead 107C and a second foot portion 128 thereof attached to lead 107A. Similarly, the second wire 140 has a first foot portion 146 thereof attached to lead 106C and a second foot portion 144 thereof attached to lead 106A. Initially, both wires 120, 140 are attached to the leadframe in an upright/vertical orientation.

Figure 8B:
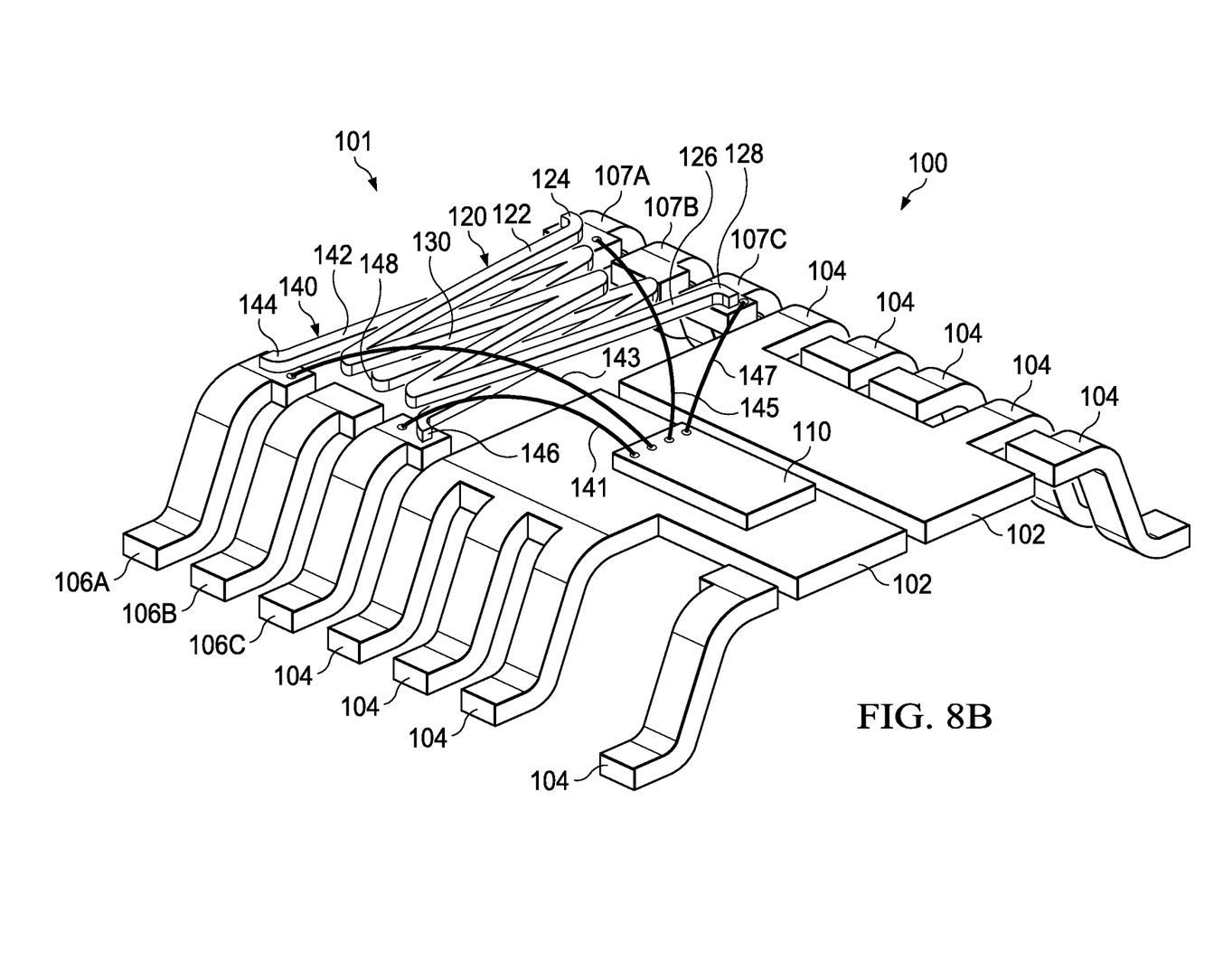
FIG. 8B is an isometric view of the example leadframe embodiment of FIG. 8 with the two sine wave shaped wires positioned in overlying relationship.
Figure 9:
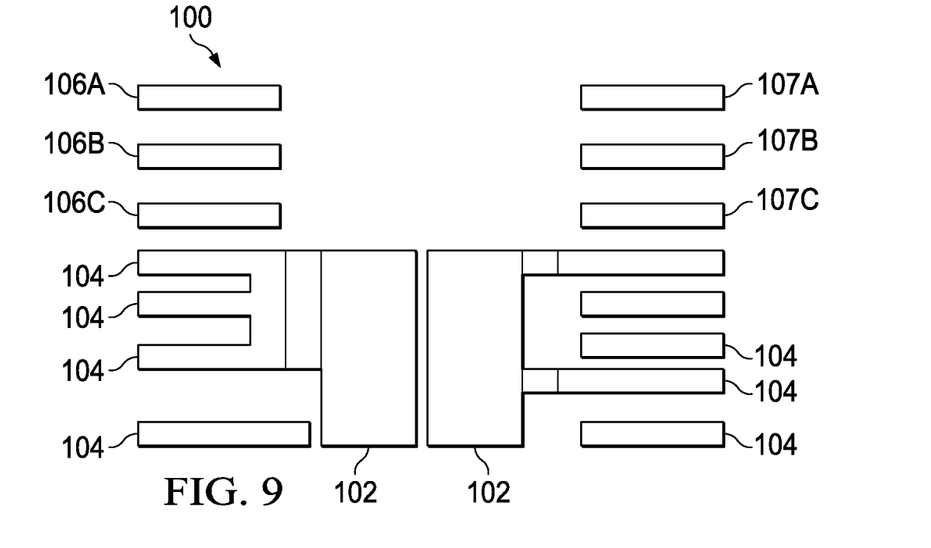
FIG. 9 is a schematic top plan view of an example lead frame embodiment showing a first stage in the production of an integrated circuit ("IC") package.
Figure 9A:
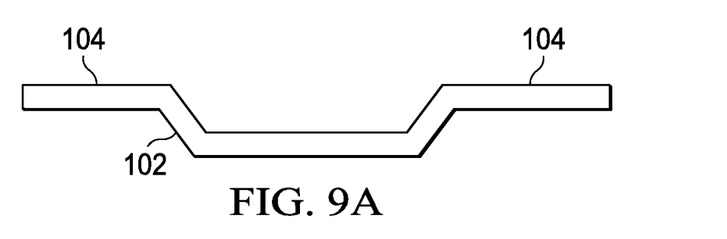
FIG. 9A is a schematic side elevation view of the lead frame embodiment of FIG. 9.

As illustrated by FIG. 8B the wires 120, 140 are subsequently bent such that they lie generally parallel to the die attachment pad 102 with the first wire 120 positioned in non-touching, overlying relationship with the second wire 140. The wires, thus positioned, form an inductor that may be attached to the die 110 as by wire bond wires A sequence of operations by which an integrated circuit package with an inductor may be produced is illustrated by FIGS. 9 through 13. FIG. 9 is a schematic top plan view of the single leadframe illustrated in FIG. 7, prior to lead shaping. As previously discussed, the lead frame 100 includes a die attach pad 102, a plurality of leads 104 adjacent to the die attach pad 102 and a plurality of leads 106A, 106B, 106C, and 107A, 107B, 107C, that are longitudinally spaced from the die attach pad 102.

Figure 10:
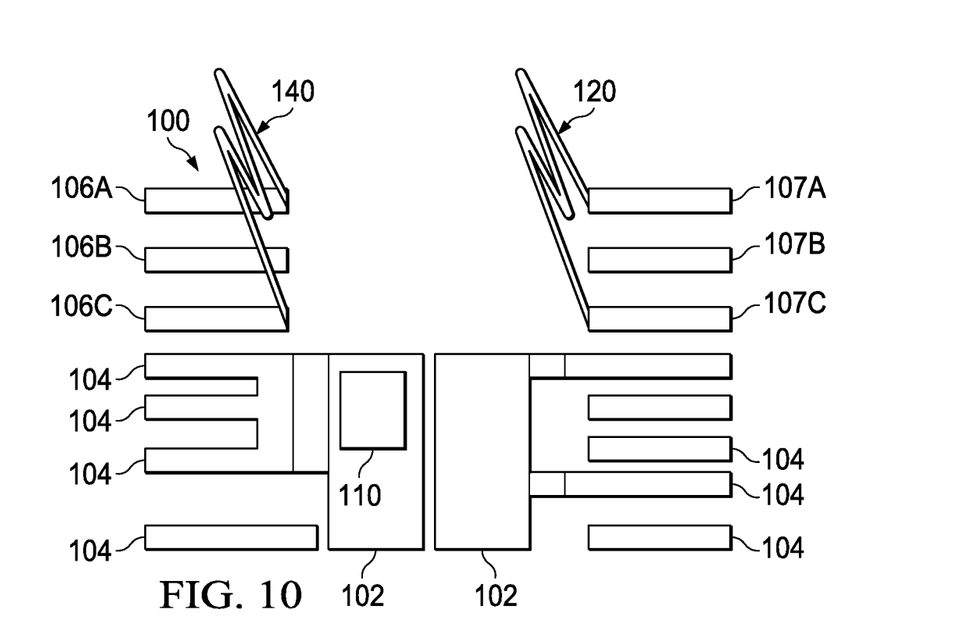
FIG. 10 is a schematic top plan view of the lead frame embodiment of FIGS. 9 and 9A illustrating a wire attachment stage in the production of an IC package.
Figure 10A:
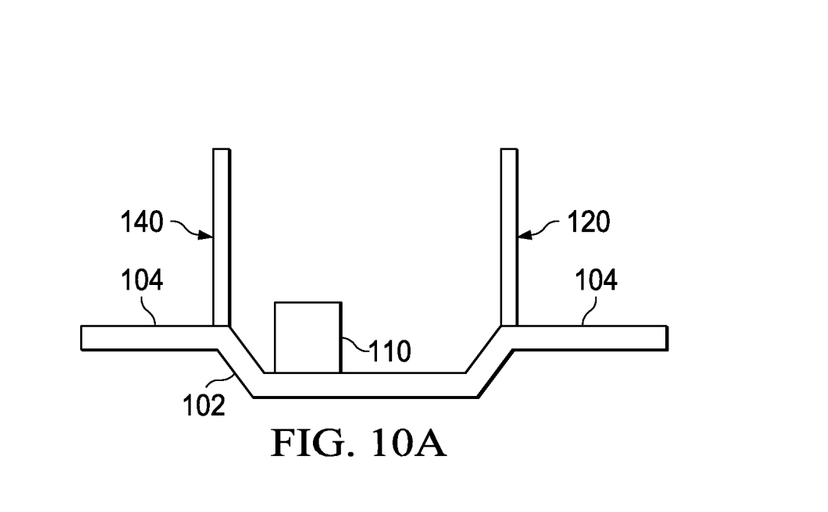

FIGS. 10 and 10A, which correspond generally to FIG. 8, illustrate the addition of two generally M-shaped wires 120, 142 to the lead frame 100 of FIG. 9, with the wires 120, 140 positioned in perpendicular relationship with the die attach pad 102. FIG. 10 also illustrates the attachment of a die 110 to the die attached pad 102. For clarity of illustration, bond wires connecting the die 110 to leads are not shown in FIGS. 10-13. Such wire bonding, in one method embodiment, takes place between the assembled state shown in FIG. 11 and the one shown in FIG. 12.

Figure 11:
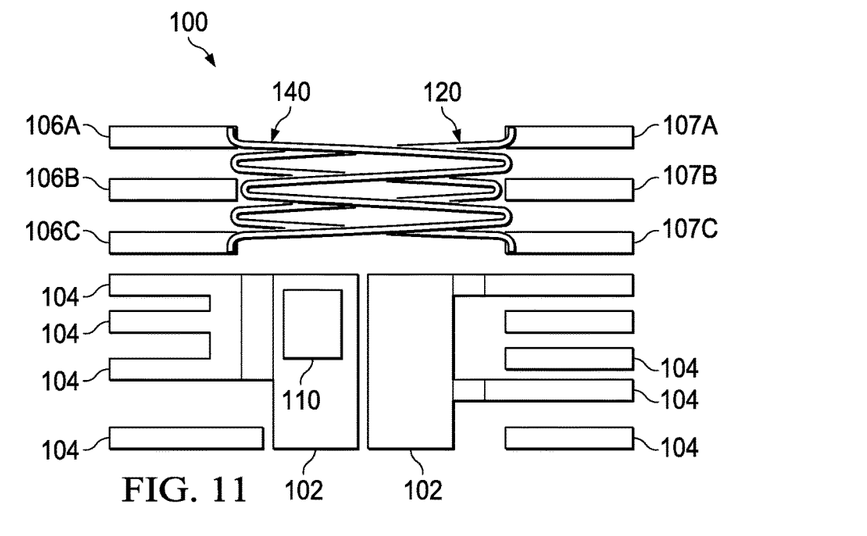
FIG. 11 is a schematic top plan view of the lead frame embodiment of FIG. 10 illustrating bending of attached wires in the production of an IC package.
Figure 11A:
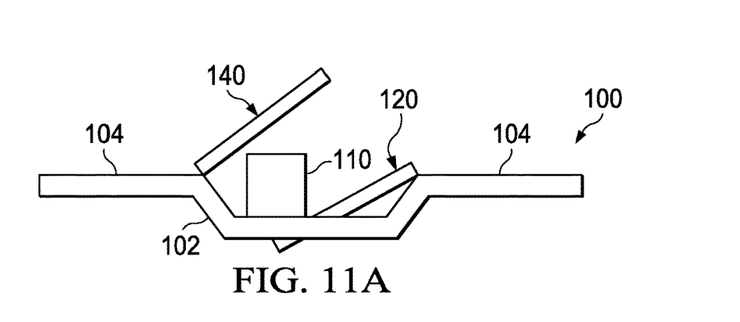
FIG. 11A is a schematic side elevation view of the lead frame embodiment of FIG. 11.

FIGS. 11 and 11A, which correspond generally to FIG. 8B, illustrate the assembly of FIG. 10 after bending of the M-shaped wires 120, 140 into overlying relationship. The wires 120, 140 are now positioned in generally parallel relationship with each other and may be parallel or somewhat skewed with respect to the die attach pad 102.

Figure 12:
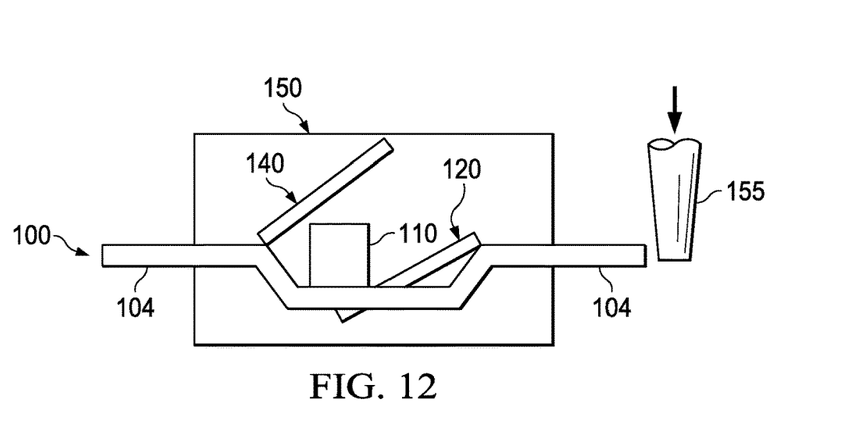
FIG. 12 is a cross-sectional side elevation view of the lead frame embodiment of FIG. 11 in another production stage in which the lead frame has been molded and singulated.

As illustrated by FIG. 12, the leadframe 100, wires 120, 140 and die 110 are next cover covered with mold compound 150, and exposed portions of the leads 104, etc., are conventionally severed from adjacent leadframes of an associated leadframe strip (not shown) as by use of a singulation saw or punch 155.

Figure 13:
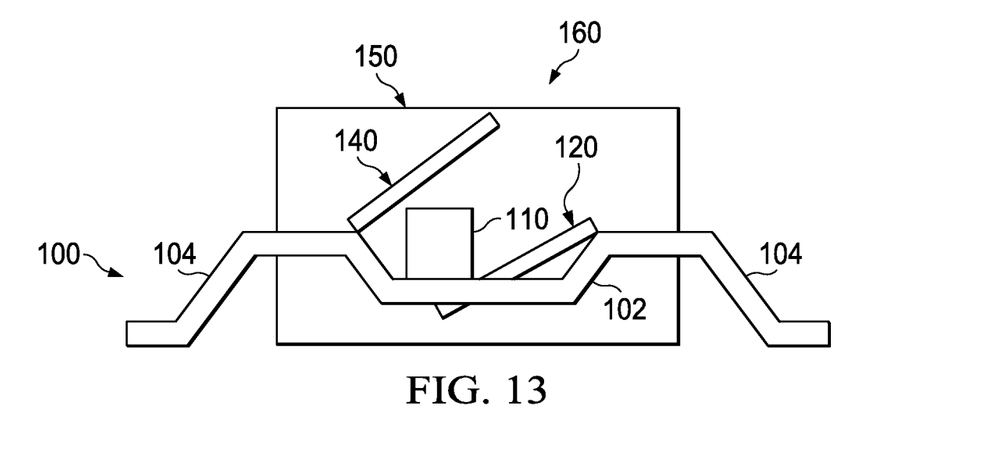
FIG. 13 is a cross-sectional side elevation view of the molded lead frame embodiment of FIG. 12 after lead forming to produce an integrated circuit package.

Next, as illustrated by FIG. 13, the exposed ends of the leads 104, etc., are conventionally formed into a proper configuration for attaching the integrated circuit package 160 thus formed to other electronic components (not shown), as with a printed circuit board (not shown).

The integrated circuit package 160 thus includes an inductor assembly formed by wires 120 and 140 that are attached to leads of a single leadframe as opposed to the integrated circuit package 60 of FIG. 6 in which two separate leadframes are used to form the inductor assembly. By eliminating one leadframe from the inductor assembly the cost of producing the integrated circuit package 160 is substantially reduce over the cost of producing the prior art package 60 of FIG. 6.

Figure 14:
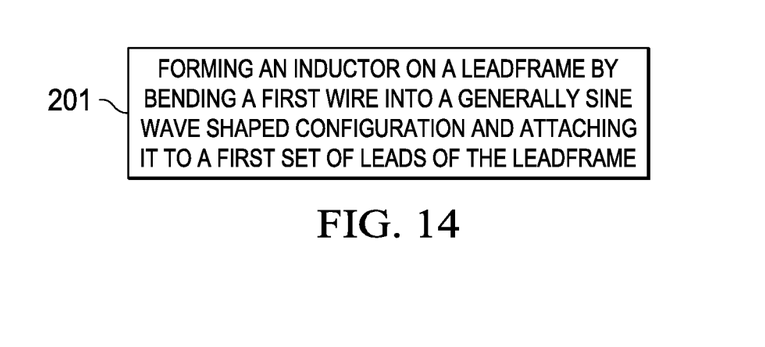
FIG. 14 is a flowchart illustrating a method of making a leadframe assembly.

FIG. 14 is a flow chart that illustrates a method of making a leadframe assembly. The method includes, as shown at block 201, forming an inductor on a leadframe by bending a first wire into a generally sine wave-shaped configuration and attaching the first wire to a first set of leads of the leadframe.

Embodiments of a leadframe assembly and a method of making a leadframe assembly are described in detail herein. Alternative embodiments of such a leadframe assembly and production methods will occur to those skilled in the art after reading this disclosure. It is intended that the language of the appended claims be construed broadly to cover such alternative embodiments, except as limited by the prior art.

What is claimed is:

1. An integrated circuit (IC) package comprising:
   a lead frame including a first plurality of leads and a second plurality of leads, and a die attach pad;
   a first bond wire attached to two leads of the first plurality of leads; and
   a second bond wire attached to two leads of the second plurality of leads, wherein a plane of the first bond wire is parallel to a plane of the second bond wire, and portions of the first bond wire and the second bond wire overlap with each other.

2. The IC package of claim 1 further comprising an IC die attached to the die attach pad and electrically connected to at least one of the plurality of first leads and at least one of the plurality of second leads.

3. The IC package of claim 1, wherein the first bond wire does not contact with the second bond wire.

4. The IC package of claim 1, wherein the first bond wire and the second bond wire are generally sine wave shaped.

5. The IC package of claim 1, wherein the first bond wire and the second bond wire are generally M shaped.

6. The IC package of claim 1, wherein the first bond wire includes two foot portions attached to the two leads of the first plurality of leads, and the second bond wire includes two foot portions attached to the two leads of the second plurality of leads.

7. The IC package of claim 6, wherein the two foot portions of each of the first bond wire and the second bond wire are wedge bonded to the two leads of the first plurality of leads and the two leads of the second plurality of leads respectively.

8. The IC package of claim 1, wherein each of the first bond wire and the second bond wire includes copper.

9. The IC package of claim 1, wherein the second plurality of leads is positioned laterally opposite the first plurality of leads.

10. The IC package of claim 1, wherein the first bond wire is wire bonded to the two leads of the first plurality of leads and the second bond wire is wire bonded to the two leads of the second plurality of leads.

11. An integrated circuit (IC) package comprising:

a lead frame including a first plurality of leads and a second plurality of leads, and a die attach pad;

a first bond wire attached to two leads of the first plurality of leads;

a second bond wire attached to two leads of the second plurality of leads, portions of the first bond wire and the second bond wire parallel to and overlapping with each other;

an IC die attached to the die attach pad and electrically connected to at least one of the plurality of first leads and at least one of the plurality of second leads; and mold compound covering portions of the lead frame, the first bond wire, the second bond wire, and the IC die.

12. The IC package of claim 11, wherein the first bond wire and the second bond wire together form an inductor.

13. The IC package of claim 11, wherein the first bond wire includes two foot portions attached to the two leads of the first plurality of leads, and the second bond wire includes two foot portions attached to the two leads of the second plurality of leads.

14. The IC package of claim 13, wherein a distance between the two foot portions of the first bond wire or the second bond wire is 750 micrometers.

15. The IC package of claim 11, wherein the IC die is electrically connected to the first bond wire and the second bond wire.

16. The IC package of claim 11, wherein planes of the first bond wire and the second bond wire are parallel to a plane of the die attach pad.

17. The IC package of claim 11, wherein portions of the first plurality of leads and the second plurality of leads extend through the mold compound.

18. The IC package of claim 11, wherein the die attach pad is a split die attach pad.

* * * * *